(12) United States Patent
Gilbert

(10) Patent No.: US 8,264,775 B2
(45) Date of Patent: Sep. 11, 2012

(54) OPTICAL SYSTEM FOR DISPLAYING AN IMAGE ON THE SURFACE OF A SOLAR PANEL

(75) Inventor: Joel Gilbert, Lambesc (FR)

(73) Assignee: Saint-Gobain Glass France, Courbevoie (FR)

(*) Notice: Subject to any disclaimer, the term of this patent is extended or adjusted under 35 U.S.C. 154(b) by 1059 days.

(21) Appl. No.: 12/161,262

(22) PCT Filed: Jan. 23, 2007

(86) PCT No.: PCT/FR2007/000122
§ 371 (c)(1),
(2), (4) Date: Apr. 6, 2010

(87) PCT Pub. No.: WO2007/085721
PCT Pub. Date: Aug. 2, 2007

(65) Prior Publication Data
US 2011/0063729 A1   Mar. 17, 2011

(30) Foreign Application Priority Data
Jan. 26, 2006 (FR) ..................... 06 00691

(51) Int. Cl.
G02B 27/10 (2006.01)

(52) U.S. Cl. ..................... 359/619; 359/620

(58) Field of Classification Search .............. 359/619
See application file for complete search history.

(56) References Cited

U.S. PATENT DOCUMENTS

| 5,303,525 | A | 4/1994 | Magee |
| 5,680,734 | A | 10/1997 | Magee |
| 6,724,536 | B2 * | 4/2004 | Magee ............ 359/619 |

FOREIGN PATENT DOCUMENTS

DE   195 19 417   11/1996

* cited by examiner

*Primary Examiner* — James Jones
(74) *Attorney, Agent, or Firm* — Oblon, Spivak, McClelland, Maier & Neustadt, L.L.P.

(57) ABSTRACT

An optical system that allows an image to be displayed on the surface of a solar panel without this image forming an obstacle to direct solar rays. The system includes a solar panel, a lenticular surface formed from linear lenses, and a transparent film on which an image, the straight bands of which, parallel to the longitudinal axis of the lenses, have been removed, is printed. At certain viewing angles, an observer can see only the image bands, whereas at other angles of incidence the sun's rays will pass through the transparent bands and reach the active surface of the solar sensor. The system is particularly suitable for, for example, aesthetic and architectural integration of solar panels, and for disseminating visual information on the surface thereof.

10 Claims, 3 Drawing Sheets

OPTICAL SYSTEM FOR DISPLAYING AN IMAGE ON THE SURFACE OF A SOLAR PANEL

CROSS-REFERENCE TO PRIORITY DOCUMENTS

Figure 1:
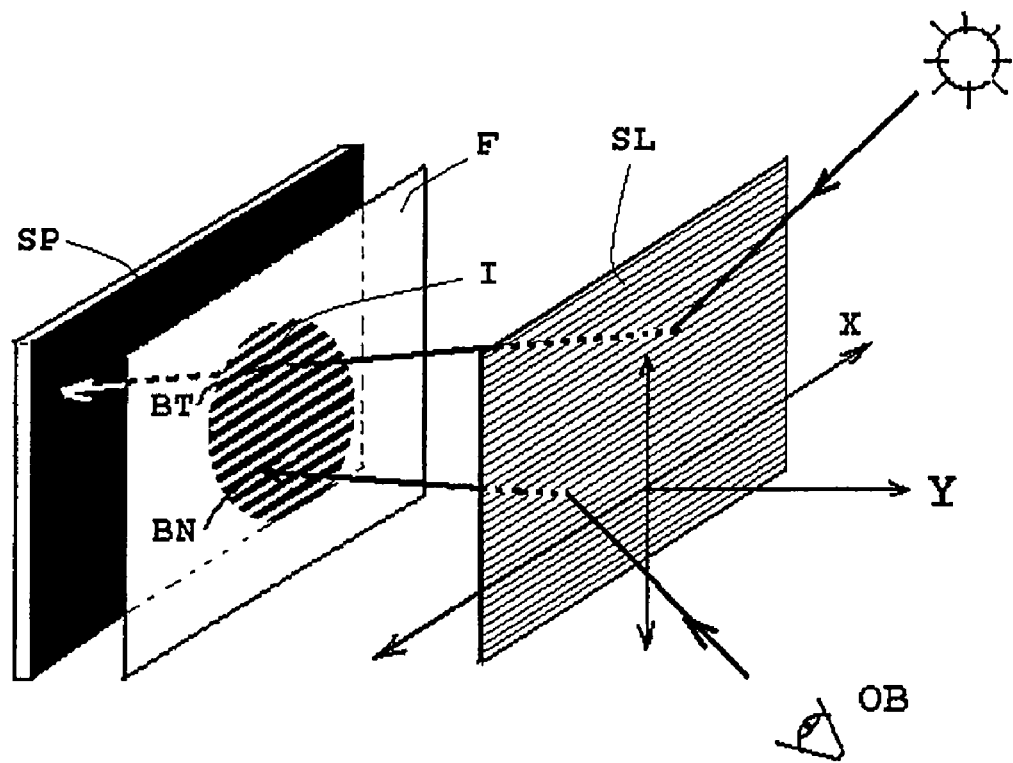

The present application is the US counterpart of WO 2007/085721, and claims priority to French Application No. 0600691 filed on Jan. 26, 2006, the entire contents of each of which are hereby incorporated herein by reference.

The present invention relates to an optical system for displaying an image on the surface of a solar panel.

The term "solar panel" is defined here by any type of surface, whether plane or curved, whose function is to convert solar energy into heat or electricity.

To obtain the best insolation efficiency, solar panels must be oriented so as to take into account the various positions of the sun on the geographical location of the installation. In general, solar panels are inclined toward the South by an angle equal to the latitude of the location. However, with the steady reduction in manufacturing costs of solar panels, especially those of the photovoltaic type using silicon in thin film form, the orientation of solar panels will become less necessary since the lack of efficiency resulting therefrom may be compensated for, without a great difference in price, by an overall increase in the active area. This will for example facilitate the vertical positioning of solar panels.

Solar panels are generally dark in color, or even completely black, contrasting greatly with the color of the supports to which they are fixed and going counter to their esthetic and architectural integration.

It is an object of the present invention to display an image on the surface of solar panels. This image will form only partly an obstacle to the direct solar rays, enabling solar panels to operate with a minimum loss of insolation while benefiting from the visual characteristics of the chosen image. By displaying this image or color, it will therefore be possible to make esthetic integration of solar panels easier. This image may also, by its content, become a means of communication of informative, indicating or advertising type. A solar panel equipped with the optical system forming the subject of this invention will be denoted hereafter by the term "imager solar panel".

The term "ambient light" is defined here as the total light received by the solar sensor. The ambient light is made up of direct sunlight and diffuse light due to the environment.

The present invention consists of a lenticular surface, an image and a solar panel. The relative arrangement of each of these elements makes it possible, at certain viewing angles, to display the image in question without seeing the surface of the solar panel, while still allowing direct solar rays, which have angles of incidence differing from the above viewing angles, to reach the active surface of the solar panel. The lenticular surface and the image will therefore not form an obstacle to direct solar rays and will only partly form an obstacle to the surrounding diffuse light.

The "imager solar panel" forming the subject of this invention consists of a transparent film on which an image, parallel equidistant straight bands of which have been removed, is printed. The term "image bands" is defined as being the remaining bands of the image, those that have not been removed. The film is positioned between the active surface of the solar panel and a lenticular surface. The lenticular surface consists of a juxtaposition of identical linear lenses, of the plano-convex type, the width of which is equal to the sum of the width of an image band and the width of a transparent band. The transparent film is positioned on the plane face side of the lenticular surface, in the focal plane of the lenses, so that the image bands and the transparent bands are parallel to the longitudinal axis of the lenses. The width of the image bands and of the transparent bands are calculated so that, within a certain range of viewing angles, an observer will see only the image bands, and therefore the image itself, whereas within another range of viewing angles the light will pass through the transparent bands and therefore reach the active surface of the solar sensor. The linear lenses in fact concentrate the light, therefore the vision, on zones of the focal plane, the position of which depends on the angle of incidence of the light at the surface of the lens. The light strikes the corrugated face of the lenticular surface with angles of incidence, measured relative to an axis perpendicular to the corrugated surface, which take values of between +45° and −45°. Zones Z1 and Z2 of the focal plane of the lens correspond to angle-of-incidence ranges [A1,A2] and [A2,A3]. By suitably positioning the image bands and the transparent bands of the image facing the zones Z1 and Z2 respectively, an observer, whose viewing angle is between A1 and A2, will see the image bands in zone Z1, and therefore the image itself, whereas the light having angles of incidence between A2 and A3 will be concentrated on the zone Z2 and will pass through the transparent bands before reaching the surface of the solar sensor. The relative positioning of the image with respect to the lenticular surface will therefore depend on the various possible positions of the observer and on the various possible positions of the sun in the sky, knowing that these various angular positions will determine the zones Z1 and Z2 where the image bands and the transparent bands will be.

To prevent multiple reflections of the light from passing from the lenticular surface to the film, and from the film to the surface of the solar sensor, the various elements may be bonded using a transparent adhesive having the same refractive index as the optical parts in contact, or else the various surfaces may be provided with an antireflection treatment. To increase accuracy and dispense with a bonding operation, the image may be printed directly on the plane face of the lenticular surface. According to one particular embodiment, the imager solar panel will have the features of the above embodiment, but the lenticular surface will this time have its plane face toward the outside, and a parallel-faced transparent plate will be inserted between the lenticular surface and the image. This transparent plate will be cut perpendicular to its surface, in a linear fashion, and at regular intervals, so as to provide thin plane air slats that are parallel to the longitudinal axis of the lenses and positioned facing each junction of the lenses. The advantage of this optical surface compared with the previous one is that the viewing angles and the angles of incidence of the solar rays may take values between −70° C. and +70° C. In other words the rays having an angle of incidence greater than 45°, after they pass through the lens, will be refracted within the plate and reflected at the surface of the air slats by means of the optical principle of a refractive index jump, so as to be redirected into the zone Z1 or Z2.

According to one particular embodiment, and so as to increase the viewing angles up to 90°, the plano-convex linear lenses according to the above embodiment are replaced by bi-convex linear lenses.

According to another embodiment, the image associated with the imager solar sensor may be remotely modifiable, for example by the use of a liquid crystal display. If the image is modified rapidly, then an animated image will be observed.

According to a variant (not illustrated), the animated image or images will be modified so that the zones of the same color as the surface of the solar sensor will be erased, becoming transparent. Thus, the rendition of the image will not be modified since, by being transparent, these zones will take on the color of the solar panel that is behind it. The light that will thus pass through the image will reach the solar sensor and therefore be added to the light already received by the sensor.

According to another embodiment, the image bands will be replaced with thin solar sensor bands and the solar panel will be replaced with a fixed or animated image. These solar sensor bands will be positioned relative to the lenticular surface so as to receive the direct rays from the sun, whereas the transparent bands will allow an observer positioned at other viewing angles to see the image, or the animated images, through the solar panel thus formed.

Figure 2:
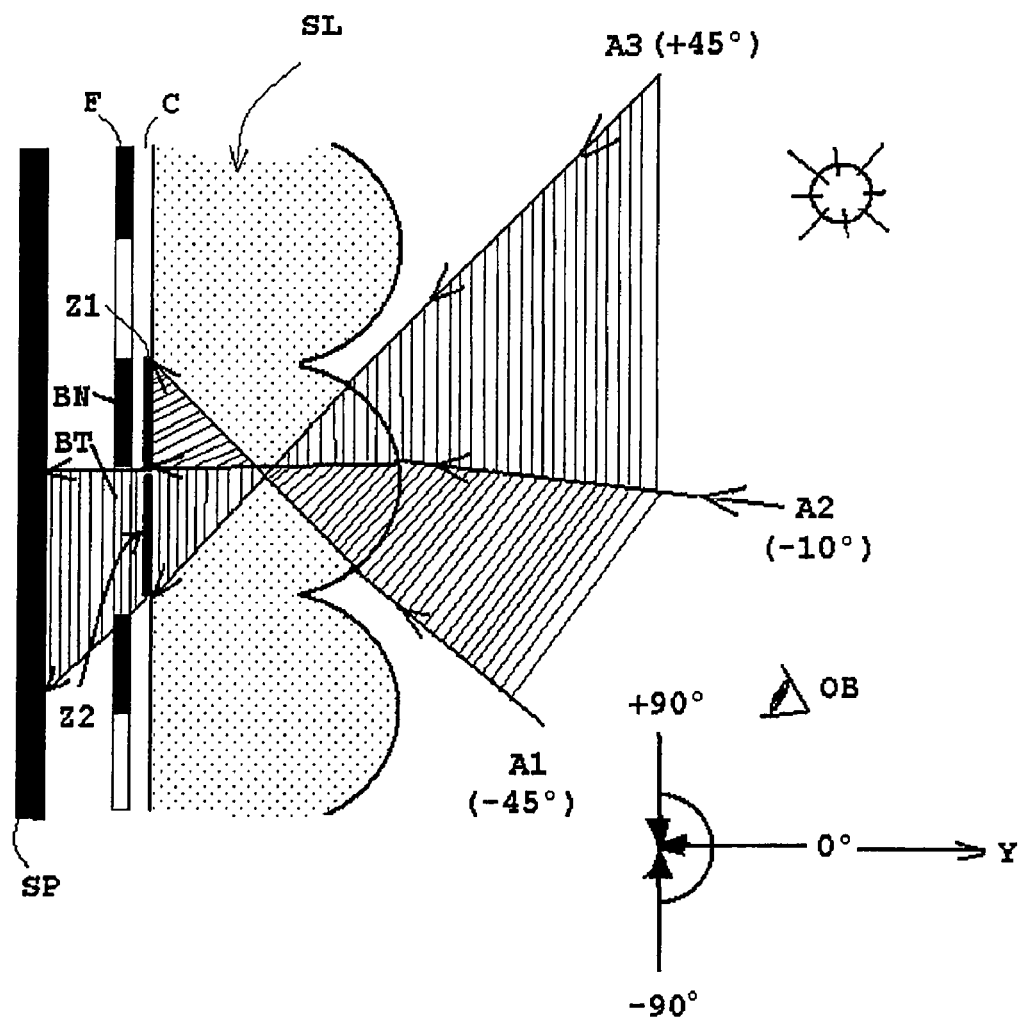
Figure 3:
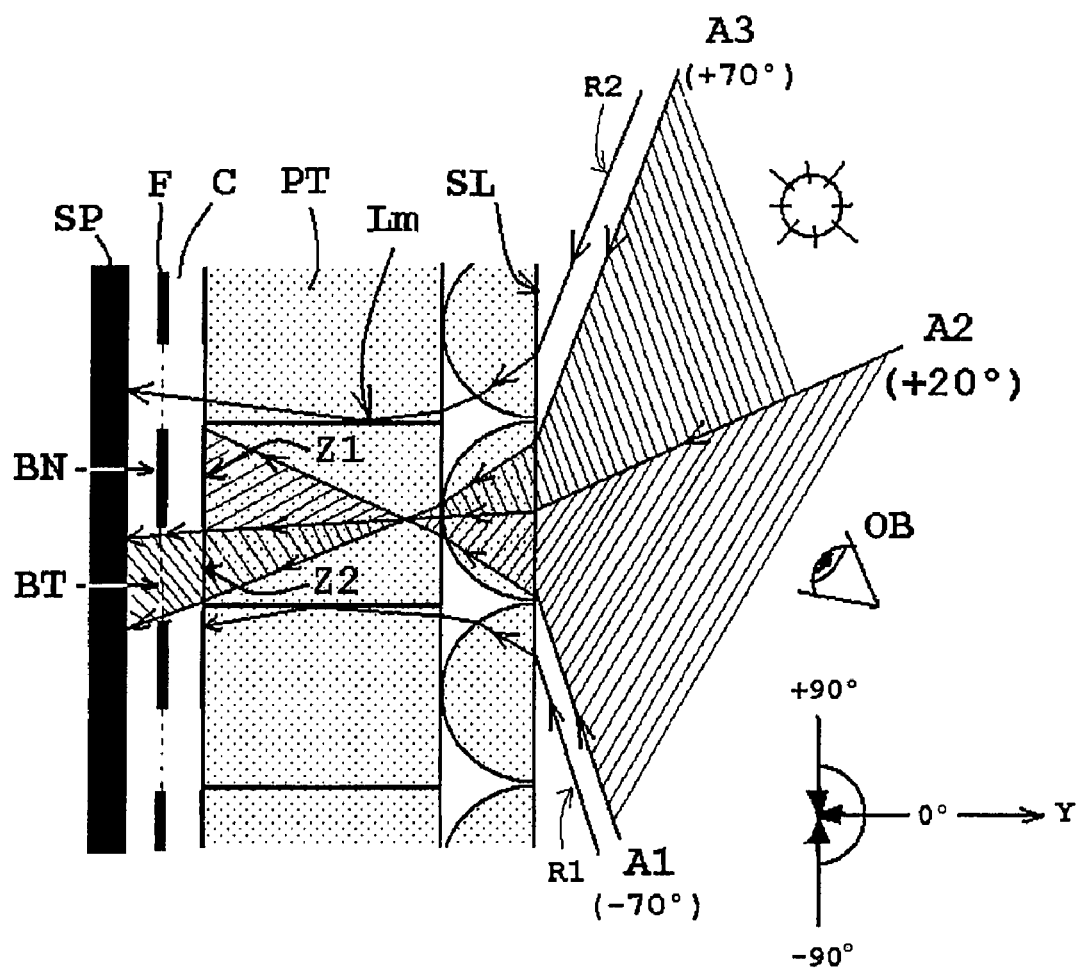

The appended drawings illustrate the invention:

FIG. 1 shows the arrangement, in an exploded view, of the various elements making up the imager solar panel;

FIG. 2 shows a sectional view and a diagram illustrating the principle of the imager solar panel, with on the one hand the vision of an image seen by an observer and, on the other hand, the optical path of the solar rays which, at the same time, reach the surface of the solar sensor; and FIG. 3 shows one particular embodiment which, in order to increase the viewing angles, uses a plano-convex lenticular surface and redirection of the rays according to the principle of reflection by a refractive index jump.

Referring to these drawings, the system is made up of a solar panel (SP), a transparent film (F), on which an image (I) is printed, and a lenticular surface (SL). The image (I) is partly erased by linear, parallel and equidistant, transparent bands (BT). The image therefore becomes an image formed from nontransparent parallel image bands (BN) and transparent parallel bands (BT). The lenticular surface is formed from identical linear lenses, of plano-convex cross section, with a width equal to the sum of the width of an image band plus the width of a transparent band, and are juxtaposed parallel to one another. The transparent film (F) is placed between the solar panel (SP) and the lenticular surface (SL), in the focal plane of the lenses, with the corrugated face of the lenticular lens turned toward the outside of the system. The image bands (BN) and the transparent bands (BT) are positioned with respect to the lenses in such a way that these bands (BN and BT) are parallel to the longitudinal axis (X) of the lenses and in such a way that, when seen at certain angles lying within the angular range [A1,A2], an observer (OB) will see only the image bands (BN). However, at other viewing angles lying within the angular range [A2,A3], the rays from the sun will pass through the transparent bands (BT) of the image and reach the surface of the solar sensor (SP). The bands (BN) and (BT) are positioned facing the zones Z1 and Z2. The zones Z1 and Z2 represent the zones of the focal plane of the linear lens that are covered by the rays whose angles of incidence lie within the ranges [A1,A2] and [A2,A3] respectively. In the case of lenses whose convex refractive surface is semicylindrical (FIG. 2), A1 and A3 will take limit values of 45°. These angles are measured relative to an axis (Y) that is perpendicular to the longitudinal axis (X) of the lenses and perpendicular to the lenticular surface (SL).

In the case of an embodiment with a plano-convex lenticular surface, the plane face of which is turned toward the outside (FIG. 3), the incident rays are concentrated on passing through the convex refractive surface of the lens and then undergo refraction on passing through the first plane face of the transparent plate (PT). Some of the rays reach the zones Z1 and Z2 directly, while other rays (R1, R2), of higher angle of incidence, are reflected at the surface of the air slat (Lm) before reaching the zones Z1 and Z2.

To reduce parasitic reflections, the various faces of the lenticular surface, of the parallel-faced plate and of the solar sensor undergo an antireflection treatment, or else the film may be bonded using a transparent adhesive (C) the refractive index of which will be identical to that of the optical parts in contact.

As a nonlimiting example, the solar panel will be of the photovoltaic type equipped with a uniform thin-film silicon coating. The solar panel, and likewise the transparent film and the lenticular surface, will be of rectangular shape with dimensions of 60 cm in width by 100 cm in height. The solar panel is inclined to the North at 22° to the vertical and its active face turned toward the South. A color image in which transparent and nontransparent horizontal bands of the same width, equal to 0.5 mm, is printed on the transparent film by screen printing. The lenticular surface is formed from linear lenses 1 mm in diameter and 1.2 mm in thickness, this being equivalent to the focal length of each lens. The lenticular surface is positioned in such a way that the longitudinal axis of the lenses is horizontal, and therefore parallel to the bands of the image. The transparent film is bonded to the plane face of the lenticular surface using a transparent adhesive and positioned accurately so that each image band lies in the top half of the focal plane of each lens. Each transparent band therefore lies in the bottom half of the focal plane of each lens. For an observer placed level with the imager solar panel, the viewing angle is equal to −22°, enabling him to see the image bands. The sun, upon passing the meridian and at a latitude of 45°, may take heights, depending on the season, that vary between 22° and 68° relative to the South horizon, and therefore the solar rays have angles of incidence relative to the solar panel of between 0° and 46°. All the solar rays will therefore pass through the transparent bands and reach the surface of the solar sensor.

The present invention is particularly suitable for esthetic and architectural integration of solar panels and for displaying visual information on the surface thereof.

The invention claimed is:

1. A solar panel associated with an optical system for displaying an image on its surface, comprising:
    a solar panel;
    a transparent printed film having an image, from which a series of parallel linear bands of identical width and equidistantly spaced apart have been removed to form a series of transparent bands and image bands; and
    a lenticular surface including a juxtaposition of identical linear lenses, a width of which is equal to a sum of a width of a transparent band plus a width of an image band, and a plane face of which is turned toward the image, a longitudinal axis of the lenses being parallel to the image bands and to the transparent bands,
    the transparent bands and the image bands being positioned between the surface of the solar panel and the lenticular surface, in a focal plane of the lenses, such that an observer will see alternatively only the image bands or only the surface of the solar panel, the alternatives depending on a viewing angle at which the lenticular surface is observed.

2. The solar panel as claimed in claim 1, wherein the linear lenses have a plano-convex and/or bi-convex cross section.

3. The solar panel as claimed in claim 2, wherein a surface of the plano-convex and/or bi-convex cross section lens has its plane face toward the outside, and a parallel-faced transparent plate is inserted between the lenticular surface and the film, the plate being cut perpendicular to its surface, in a linear manner, and at regular intervals, providing thin plane air slats parallel to the longitudinal axis of the lenses and positioned facing each junction of the lenses.

4. The solar panel as claimed in claim 1, wherein optical surfaces include an antireflection coating.

5. The solar panel as claimed in claim 1, wherein the films are bonded to the optical surfaces by a transparent adhesive, the refractive index of which is identical to that of the optical parts in contact.

6. The solar panel as claimed in claim 1, wherein zones of the image that are of a same color as the surface of the solar panel are removed, becoming transparent.

7. The solar panel as claimed in claim 1, wherein the image bands are replaced with solar sensor bands and the solar panel is replaced with an image.

8. The solar panel as claimed in claim 1, wherein the image is an animated image.

9. The solar panel as claimed in claim 1, wherein the image bands and the transparent bands are positioned such that light is concentrated and passes through the transparent bands to reach the surface of the solar panel.

10. The solar panel as claimed in claim 1, wherein the image is formed by a liquid-crystal display.

* * * * *